United States Patent
Pham et al.

(10) Patent No.: US 11,637,234 B2
(45) Date of Patent: Apr. 25, 2023

(54) MANUFACTURING METHOD FOR MULTILAYER STRUCTURE OF MAGNETIC BODY AND BISB LAYER, MAGNETORESISTIVE MEMORY, AND PURE SPIN INJECTION SOURCE

(71) Applicant: TOKYO INSTITUTE OF TECHNOLOGY, Tokyo (JP)

(72) Inventors: Nam Hai Pham, Tokyo (JP); Huynh Duy Khang Nguyen, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 91 days.

(21) Appl. No.: 16/647,788

(22) PCT Filed: Sep. 14, 2018

(86) PCT No.: PCT/JP2018/034191
§ 371 (c)(1),
(2) Date: Mar. 16, 2020

(87) PCT Pub. No.: WO2019/054484
PCT Pub. Date: Mar. 21, 2019

(65) Prior Publication Data
US 2020/0279992 A1  Sep. 3, 2020

(30) Foreign Application Priority Data
Sep. 15, 2017  (JP) .............................. JP2017-177564

(51) Int. Cl.
*H01L 43/04* (2006.01)
*H01L 27/22* (2006.01)
(Continued)

(52) U.S. Cl.
CPC ............ *H01L 43/04* (2013.01); *H01L 27/228* (2013.01); *H01L 43/06* (2013.01); *H01L 43/10* (2013.01); *H01L 43/14* (2013.01)

(58) Field of Classification Search
CPC ....... H01L 27/228; H01L 43/04; H01L 43/06; H01L 43/10; H01L 43/14
See application file for complete search history.

(56) References Cited

U.S. PATENT DOCUMENTS

2012/0168206 A1  7/2012  Sekine et al.
2018/0123028 A1*  5/2018  Shiokawa ............... H01L 43/04
(Continued)

FOREIGN PATENT DOCUMENTS

CN  103069564 A  4/2013
EP  3680938 A1  7/2020
(Continued)

OTHER PUBLICATIONS

Emoto et al., "Conversion of pure spin current to charge current in amorphous bismuth", Journal of Applied Physics, 115, 17C507 (2014).
(Continued)

*Primary Examiner* — Latanya N Crawford Eason
(74) *Attorney, Agent, or Firm* — Cantor Colburn LLP

(57) ABSTRACT

A magnetoresistive memory cell includes an MTJ element including a magnetization free layer and a pure spin injection source. The pure spin injection source includes a BiSb layer coupled to the magnetization free layer. By flowing an in-plane current through the BiSb layer, this arrangement is capable of providing magnetization reversal of the magnetization free layer.

9 Claims, 15 Drawing Sheets

(51) Int. Cl.
  *H01L 43/06* (2006.01)
  *H01L 43/10* (2006.01)
  *H01L 43/14* (2006.01)

(56) References Cited

U.S. PATENT DOCUMENTS

| | | | | |
|---|---|---|---|---|
| 2018/0166197 A1* | 6/2018 | Wang | ..................... | H01L 43/10 |
| 2018/0351084 A1* | 12/2018 | Sasaki | ..................... | H01L 43/02 |
| 2018/0366172 A1* | 12/2018 | Wang | ..................... | H01L 43/08 |

FOREIGN PATENT DOCUMENTS

| | | |
|---|---|---|
| JP | S60160015 A | 8/1985 |
| JP | H08249875 A | 9/1996 |
| JP | 2013175680 A | 9/2013 |
| JP | 2014045196 A | 3/2014 |
| JP | 2017059690 A | 3/2017 |
| WO | 2017034563 A1 | 3/2017 |
| WO | 2017090726 A | 6/2017 |
| WO | 2017090728 A1 | 6/2017 |
| WO | 2017090730 A1 | 6/2017 |
| WO | 2017090736 A1 | 6/2017 |

OTHER PUBLICATIONS

Emoto et al., "Transport and spin conversion of multicarriers in semimetal bismuth" American Physical Society, Physical Review B 93, 174428 (2016).
International Preliminary Report on Patentablity for international Application No. PCT/JP2018/034191, dated Aug. 23, 2019.
International Search Report for international Application No. PCT/JP2018/034191, dated Nov. 20, 2018.
Sahin et al., "Tunable Giant Spin Hall Conductivities in a Strong Spin-Orbit Semimetal: Bi1—xSbx" American Physical Society, Physical Review Letters, PRL 114, 107201 (2015).
Meissner Bolte Request to start examination with amendments for corresponding EP Application No. 18856532.9, dated Nov. 19, 2021.
Khang et al. "A conductive topological insulator with large spin Hall effect for ultralow power spin-orbit torque switching," Nature Materials vol. 17, pp. 808-813 (2018).
Li et al.: Materials Requirements of High-Speed and Low-Power Spin-Orbit-Torque Magnetic Random-Access Memory, IEEE Journal of Election Devices Society; vol. 8, pp. 674-680, (2020).
Ohya et al., "Observation of the inverse spin Hall effect in the topological crystalline insulator SnTe using spin pumping," Physical Review B vol. 96, 094424 (2017); 5 pages.
Sahin et al., "Tunable Giant Spin Hall Conductivities in a Strong Spin-Orbit Semimetal: Bi1—xSbx." Physical Review Letters, vol. 114, 107201;Mar. 13, 2015; 5 pages.
Korean Office Action for corresponding JP Application No. 10-2020-7007204; dated Oct. 20, 2022.
Khang et al., "A conductive topological insulator with colossal spin Hall effect for ultra-low power spin-orbit-torque switching", arxiv.org, Cornell University, Dated: Sep. 22, 2017; 22 pages.
Ueda et al., "Epitaxial growth and characterization of Bi1—xSbx spin Hall thin films on GaAs(111)A substrates", Applied Physics Letters, vol. 110, No. 6; Dated: Feb. 6, 2017; 5 pages.
EPO Extended European Search Report for corresponding EP Application No. 18856532.9; dated May 3, 2021.
SIPA First Office Action for corresponding CN Application No. 201880059587X; dated Mar. 1, 2023.

* cited by examiner

| Bi (10nm) |
| MnGa (10nm) |
| GaAs(001) |

$T_{sub}=100°C$
Rate=2nm/min

Bi layer(2nm)

| Bi (30nm) |
| MnGa (10nm) |
| GaAs(001) |

$T_{sub}=200°C$
Rate=2nm/min

Bi layer(2nm)

| $Bi_{0.7}Sb_{0.3}$ (20nm) |
| MnGa (10nm) |
| GaAs(001) |

$T_{sub}=250°C$
Rate=2nm/min

BiSb layer(2nm)

| Sb (20nm) |
| MnGa (10nm) |
| GaAs(001) |

$T_{sub}=250°C$
Rate=2nm/min

Sb layer(2nm)

FIG. 12

|  | $\theta_{sh}$ | $\sigma$ ($\Omega^{-1}m^{-1}$) | $\sigma_{sh}$ ($\frac{\hbar}{2e}\Omega^{-1}m^{-1}$) |
|---|---|---|---|
| Ta | 0.15(△) | $5.3 \times 10^5$(◎) | $0.8 \times 10^5$ |
| W | 0.4(△) | $4.7 \times 10^5$(◎) | $1.9 \times 10^5$ |
| Pt | 0.08(×) | $4.2 \times 10^6$(◎) | $3.4 \times 10^5$ |
| Bi$_2$Se$_3$ | 2-3.5(○) | $5.7 \times 10^4$(△) | $1.1$-$2.0 \times 10^5$ |
| (BiSb)$_2$Te$_3$ | 2(○) | $2.2 \times 10^4$(△) | $0.4 \times 10^5$ |
| BiSb (PRESENT DISCLOSURE) | 52(◎) | $2.5 \times 10^5$(◎) | $1.3 \times 10^7$ |

MANUFACTURING METHOD FOR MULTILAYER STRUCTURE OF MAGNETIC BODY AND BISB LAYER, MAGNETORESISTIVE MEMORY, AND PURE SPIN INJECTION SOURCE

CROSS REFERENCE TO RELATED APPLICATIONS

This is the U.S. national stage of application No. PCT/JP2018/034191, filed on Sep. 14, 2018. Priority under 35 U.S.C. § 119(a) and 35 U.S.C. § 365(b) is claimed from Japanese Application No. 2017-177564, filed Sep. 15, 2017, the disclosure of which is also incorporated herein by reference.

BACKGROUND OF THE INVENTION

1. Field of the Invention

The present invention relates to magnetoresistive memory.

2. Description of the Related Art

In recent years, nonvolatile memory having an advantage of low power consumption is being intensively developed. In particular, magnetoresistive memory (MRAM) is very promising. In addition to a nonvolatile memory function, MRAM exhibits very favorable properties such as 10-ns order high-speed operation, and dramatically improved memory writing durability (ensuring a number of write operations of $10^{16}$ or more). Accordingly, in a case in which such MRAM is employed as nonvolatile memory built into an integrated circuit in addition to employing it as main memory, it is anticipated that, by using the power gating effect, such an arrangement is capable of providing a 90 percent reduction in power consumption by the integrated circuit.

Each memory element (MTJ; magnetic tunnel junction) of first-generation MRAM employs a magnetization reversal method using a magnetic field. However, the magnetization reversal using the magnetic field has a problem of large energy consumption. As the second-generation writing technique developed in the 2000s, the spin injection magnetization reversal method was researched and developed, and was put to practical use in around 2012. In the spin injection magnetization reversal technique, a spin polarization current is injected from a magnetization pinned layer to a magnetization free layer included in the MTJ element so as to cause magnetic reversal due to the spin transfer torque (STT). MRAM employing this technique is known as so-called STT-MRAM. In order to cause the spin injection magnetization reversal, a spin current $I_S$ represented by the following Expression is injected in the form of the spin polarization current. The spin current $I_S$ represents the flow of the spin angular momentum per unit time.

$$I_S = (h_{bar}/2e)/(P \cdot I)$$

$h_{bar}$: Plank's constant
e: elementary charge
I: current
P: spin polarization of the magnetic electrode material The upper limit of P is defined as 1. Typical materials have a spin polarization on the order of 0.5. As can be understood from this Expression, in the spin injection magnetization reversal technique, the spin current does not exceed $(h_{bar}/2e) \cdot I$. This is because there is a physical limit in that each electron can only transfer a spin angular momentum of $h_{bar}/2$. MRAM is configured as nonvolatile memory. Accordingly, in the standby state, MRAM does not consume power. However, MRAM still has a problem of energy consumption that is an order of magnitude larger than other kinds of memory such as SRAM or the like. Furthermore, in order to provide a large write current, a large driving transistor is required. Accordingly, it is difficult to increase the capacity of MRAM.

FIG. 1 is a schematic diagram for explaining a magnetization reversal method using a pure spin current. A ferromagnetic layer is coupled to a material having a strong spin-orbit interaction. When a current I flows through such a material layer, a pure spin current $I_S$ flows in the perpendicular direction. Such a phenomenon is known as the spin Hall effect. There is a relation between the pure spin current density Js and the current density J, which is represented by Js=$(h_{bar}/2e) \cdot \theta_{sh} \cdot J$. Here, $\theta_{sh}$ represents a parameter that reflects the strength of the spin orbit interaction, which is referred to as the spin Hall angle. Accordingly, the following relation holds true between the pure spin current $I_S$ and the current I.

$$I_S = (h_{bar}/2e) \cdot (L/t_N) \cdot \theta_{sh} \cdot I.$$

That is to say, substantially, such an arrangement allows each electron to generate a spin of $(L/t_N) \cdot \theta_{sh}$. It can be understood that, if $(L/t_N) \cdot \theta_{sh} \gg 1$, such an arrangement using a pure spin current provides magnetization reversal with higher efficiency than that provided by an arrangement employing ordinary spin injection magnetization reversal. Typically, $(L/t_N)$ is in a range between 5 and 10. Accordingly, in a case in which a spin Hall material having a $\theta_{sh}$ that is larger than 1 is employed, this arrangement allows the current and electric power required for the occurrence of magnetization reversal in the MRAM element to be reduced by an order of magnitude. Furthermore, the pure spin current injection magnetization reversal method provides magnetization reversal with higher speed by approximately one order of magnitude. Such an arrangement allows the writing energy to be reduced by two orders of magnitude. Such MRAM using pure spin current injection based on the spin Hall effect is known as spin-orbit-torque (SOT) MRAM.

RELATED ART DOCUMENTS

Non-Patent Document 1

"Conversion of pure spin current to charge current in amorphous bismuth", J. Appl. Phys. 115, 17C507 (2014).

Non-Patent Document 2

"Transport and spin conversion of multicarriers in semimetal bismuth", Phys. Rev. B 93,174428 (2016).

Non-Patent Document 3

"Tunable Giant Spin Hall Conductivities in a Strong Spin-Orbit Semimetal: Bi1-xSbx", Phys. Rev. Lett. 114, 107201 (2015).

As spin Hall materials, Pt, W, Ta, and the like, which are heavy metal materials, have been researched. Such materials are each a metal material. Accordingly, such materials each have high electrical conductivity on the order of $10^5 \, \Omega^{-1} m^{-1}$, but has an unsatisfactory $\theta_{sh}$ on the order of 0.1. In contrast, a topological insulator, which has attracted attention in recent years, has a very high $\theta_{sh}$ ranging between 2 and 3. However, a topological insulator has a low electrical conductivity on the order of $10^3$ and $10^4$ $\Omega^{-1}m^{-1}$. Accordingly, in a case in which such a topological insulator is employed in MRAM, very little current flows through the topological insulator and most current flows through the other metal layers, which is impractical.

SUMMARY OF THE INVENTION

The present invention has been made in view of such a situation. Accordingly, it is an exemplary purpose of an embodiment of the present invention to provide a spin Hall material having a large spin Hall angle and magnetoresistive memory employing such a spin Hall material.

An embodiment of the present invention relates to magnetoresistive memory. The magnetoresistive memory comprises: an MTJ (magnetic tunnel junction) element comprising a magnetization free layer; and a pure spin injection source comprising a BiSb layer coupled to the magnetization free layer. The magnetoresistive memory is structured to flow an in-plane current through the BiSb layer so as to provide magnetization reversal of the magnetization free layer.

With this embodiment, write current and write electric power can be reduced.

Also, the BiSb layer may be structured as a crystalized layer. With such an arrangement in which the BiSb layer is formed as a crystalized layer, this arrangement provides the BiSb layer with a very large spin Hall angle, thereby providing the magnetoresistive memory with further improved performance.

Another embodiment of the present invention relates to a manufacturing method for magnetoresistive memory. The manufacturing method comprises: forming a magnetization free layer; and forming a pure spin injection source comprising a BiSb layer. The BiSb layer is formed at a substrate temperature of 200 to 250° C.

Yet another embodiment of the present invention relates to a manufacturing method for a multilayer structure of a magnetic body and a BiSb layer. The BiSb layer is formed at a substrate temperature of 200 to 250° C.

In a case in which the BiSb layer is formed under this condition, a BiSb layer having high-quality crystallinity can be formed. This provides a spin Hall material having a large spin angle.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 12 is a diagram showing the spin Hall angle $\theta_{sh}$ at room temperature, the electrical conductivity σ, and the spin Hall conductivity $\sigma_{sh}$ for each material of the pure spin injection source;

DETAILED DESCRIPTION OF THE INVENTION OUTLINE

Figure 1:
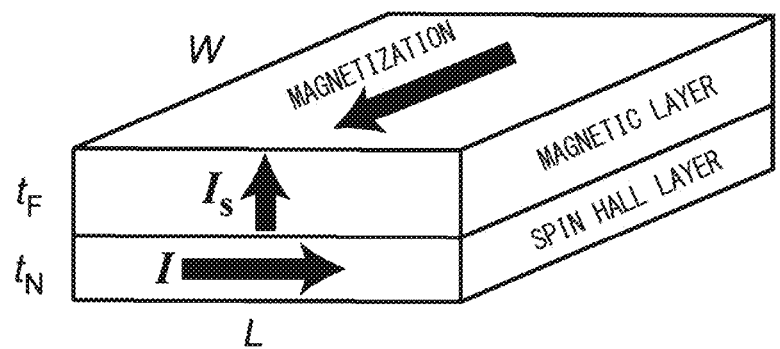
FIG. 1 is a schematic diagram for explaining a magnetization reversal method using a pure spin current.

In the present disclosure, description will be made directing attention to a BiSb material, which has both the high conductivity of a heavy metal material and the large spin Hall angle of a topological insulator. The BiSb material has been known as a conventional material. However, research on the BiSb material has been limited to research on amorphous BiSb. For example, as prior research, several reports are known with respect to a Bi layer formed on a NiFe substrate. The spin Hall angle $\theta_{sh}$ provided by the amorphous Bi layer evaluated in these reports is only 0.02 (Non-patent document 1) or only 0.00012 (Non-patent document 2), which is very small. Furthermore, such an arrangement has the potential to have a dead layer configured as a non-magnetic layer on the interface between the BiSb layer and a magnetic layer, which drastically degrades the magnetic characteristics of the magnetic layer. This has also been a disincentive to further research.

The performance of the spin Hall effect is represented by an index which is called spin Hall conductivity, calculated as the product of the electrical conductivity σ and the spin Hall angle $\theta_{sh}$, i.e., represented by $\sigma_{sh}=(h_{bar}/2e) \cdot \sigma \times \theta_{sh}$. However, in a theoretical calculation, a crystallized BiSb material has $\sigma_{sh}$ of only $4.9 \times 10^4 \cdot (h_{bar}/2e)$ $\Omega^{-1}m^{-1}$ at maximum (Non-patent document 3). Accordingly, it has been believed that the BiSb material provides a $\theta_{sh}$ on the order of only 0.5 at maximum.

Based on these reports, it has been considered that BiSb material has no potential to provide a large spin Hall angle. It is a fact that there has been no research following the prior research.

Despite the negative results obtained in the prior research, the present inventors have considered that, if a high-quality crystalized BiSb material is formed on a magnetic metal material, such an arrangement has the potential to provide both high electrical conductivity and a high spin Hall angle. Such an arrangement that supports both the advantages described above has the potential to become a great breakthrough for developing magnetoresistive memory.

Description will be made regarding a film forming method for forming a BiSb film on a magnetic material, and regarding evaluation results of the pure spin injection magnetization reversal performance provided by the BiSb film thus formed.

(1) Formation of BiSb Film

A BiSb alloy material has a hexagonal crystal structure. In contrast, most kinds of magnetic metal materials employed in MRAM have a tetragonal crystal structure. Accordingly, it was not known if a high-quality crystalized BiSb film could be formed on such a magnetic metal layer. Accordingly, first, film forming conditions for forming a BiSb film on a magnetic material were researched.

In FIGS. 2A through 2D, each upper part shows a cross-sectional view of a multilayer structure of a magnetic layer and a BiSb layer, and each lower part shows a high-energy electron diffraction (RHEED) image thereof.

A molecular beam epitaxial growth method (MBE method) was employed for BiSb crystal growth. In this method, Bi material and Sb material can be evaporated from different sources, thereby allowing the composition of Bi and Sb to be adjusted in a simple manner. However, in a case in which there is no need to adjust the BiSb composition in particular from that fixed beforehand, the BiSb film may be formed by means of a sputter method using a BiSb target having a fixed composition. In order to provide a high-quality BiSb crystalized film using the MBE method or the sputter method, the substrate temperature is required to be set to 200° C. to 250° C.

Figure 2A:
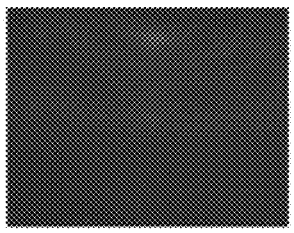
In FIGS. 2A through 2D, each upper part shows a cross-sectional view of a multilayer structure of a magnetic layer and a BiSb layer, and each lower part shows a high-energy electron diffraction (RHEED) image thereof.
Figure 2B:
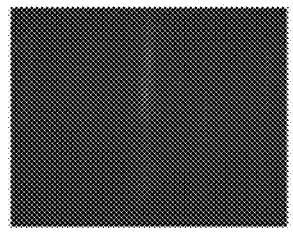
Figure 2C:
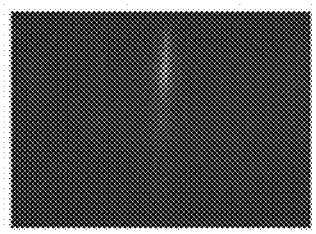
Figure 2D:
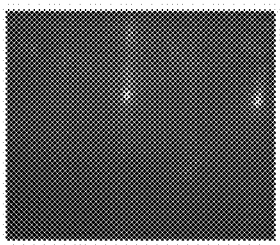

FIG. 2A shows a structure in which a Bi layer of 10 nm is grown on a MnGa magnetic layer of 10 nm at a substrate temperature of 100° C. FIG. 2B shows a structure in which a Bi layer of 30 nm is grown on a MnGa magnetic layer of 10 nm at a substrate temperature of 200° C. FIG. 2C shows a structure in which a BiSb layer of 20 nm is grown on a MnGa magnetic layer of 10 nm at a substrate temperature of 250° C. FIG. 2D shows a structure in which a Sb layer of 20 nm is grown on a MnGa magnetic layer of 10 nm at a substrate temperature of 250° C. In each case, the growth rate is set to 2 nm/min. RHEED was measured when the film thickness reached 2 nm.

As shown in FIG. 2A, in a case in which the substrate temperature was 100° C., only a dark RHEED image was observed. As shown in FIG. 2B, in a case in which the substrate temperature was 200° C., a clear streak RHEED image was observed. Also, as shown in FIGS. 2C and 2D, in a case in which the film was formed at a substrate temperature of 250° C., a clear streak was observed. That is to say, it has been found that high-quality BiSb was formed. Furthermore, based on X-ray analysis results, it has been found that the BiSb material has a (012) orientation. Based on the results described above, it has been found that film formation at a substrate temperature of 200° C. or more provides a high-quality BiSb film formed on a magnetic metal substrate having a tetragonal crystal structure.

Figure 3:
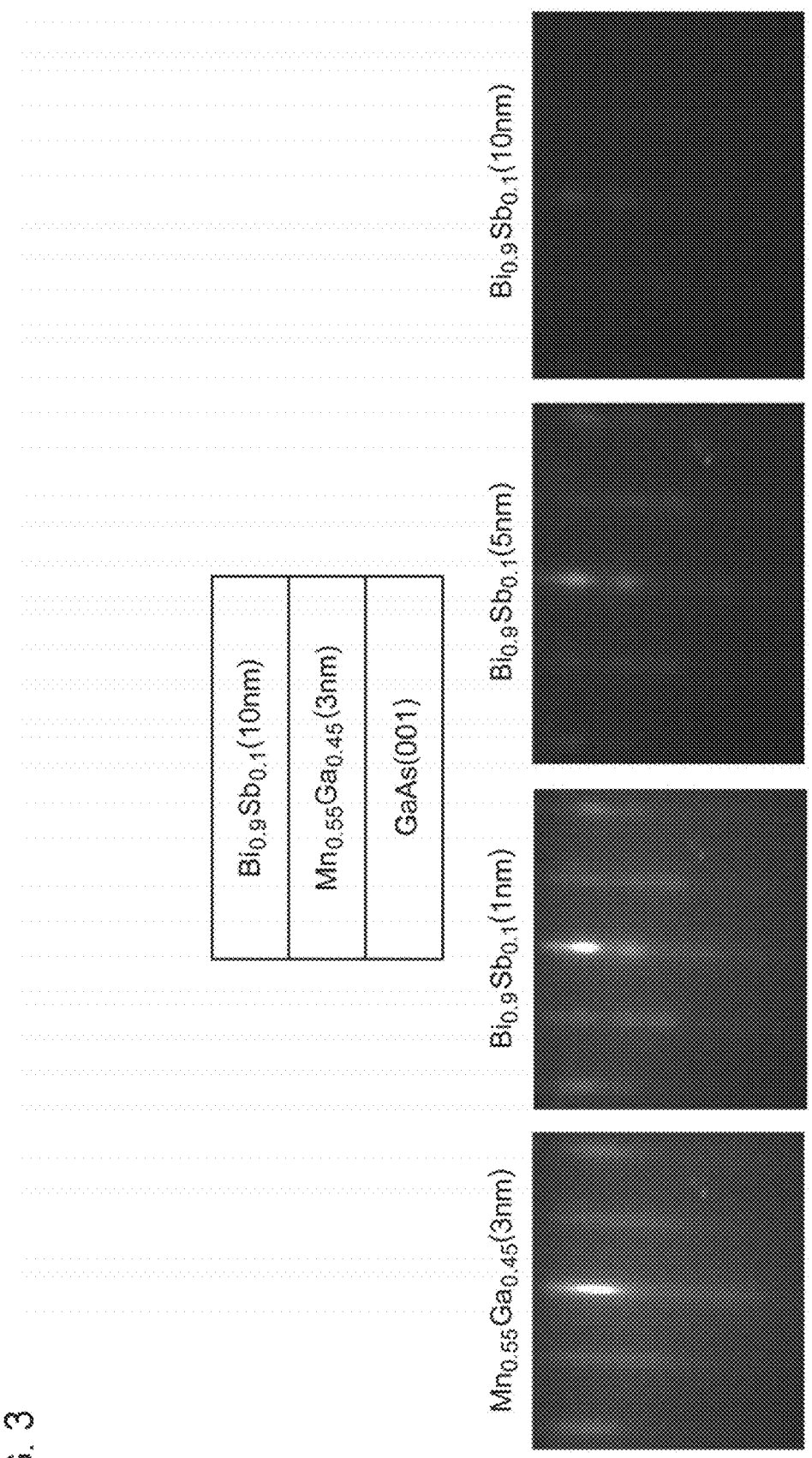
FIG. 3 shows a cross-sectional view of a MnGa/BiSb multilayer structure according to an embodiment (upper part) and an RHEED image (lower part)

FIG. 3 is a diagram showing a cross-sectional view (upper part) of a MnGa/BiSb multilayer structure (which is also referred to as a "MnGa/BiSb junction") according to an embodiment and the RHEED images thereof (lower part). In this example, first, after a perpendicularly magnetized MnGa magnetic thin film of 3 nm was formed, a $Bi_{0.9}Sb_{0.1}$ of 10 nm was formed. The RHEED images were acquired after the magnetic layer (MnGa) of 3 nm was formed, and immediately after the heavy metal layer (BiSb) reached 1 nm, 5 nm, and 10 nm, respectively. Very clear streak diffraction images were observed at an interface between the MnGa layer and the BiSb layer. As the film thickness of the BiSb layer became larger, the RHEED image intensity became lower, but did not become zero. Based on the results described above, it has been found that a dramatically flat interface having no segregation was obtained between the MnGa layer and the BiSb layer.

Figure 4:
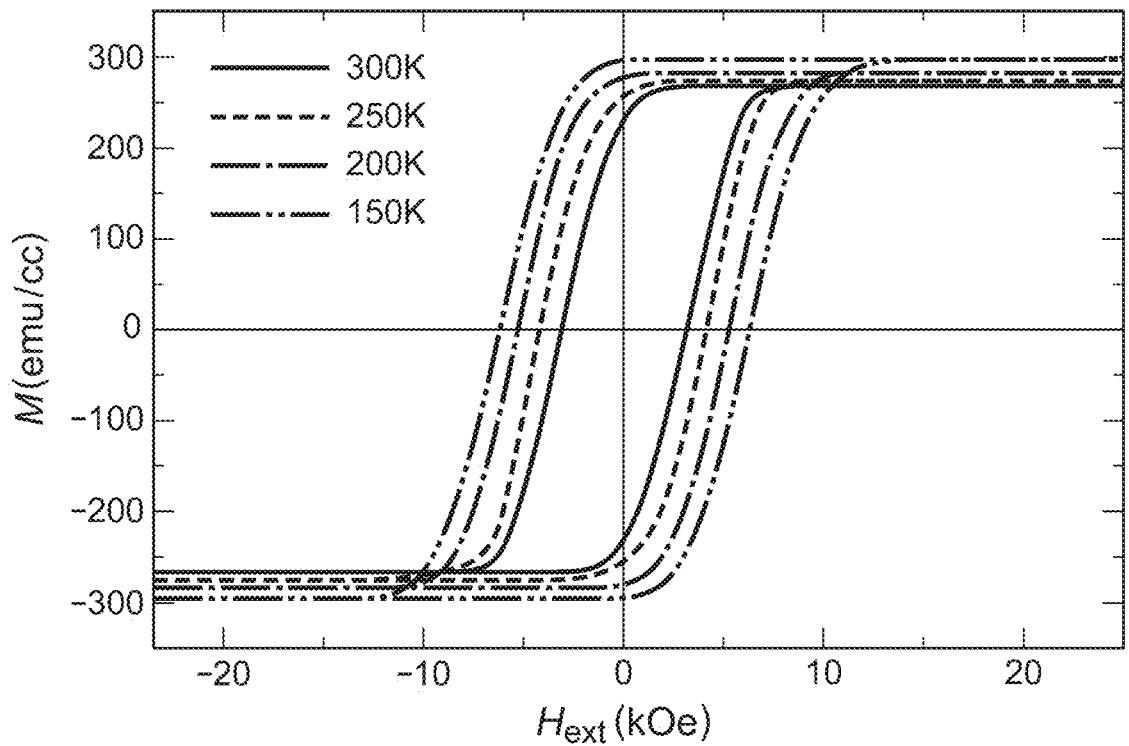
FIG. 4 is a diagram showing the magnetic characteristics of the MnGa/BiSb multilayer structure shown in FIG. 3.

FIG. 4 is a diagram showing the magnetic characteristics of the MnGa/BiSb multilayer structure shown in FIG. 3. In a case in which the BiSb layer is formed on the MnGa layer, such a structure exhibits the same magnetic characteristics as those of a MnGa layer having a single-layer structure. Thus, it has been found that there is no magnetic dead layer at the interface between the MnGa layer and the BiSb layer.

Figure 5:
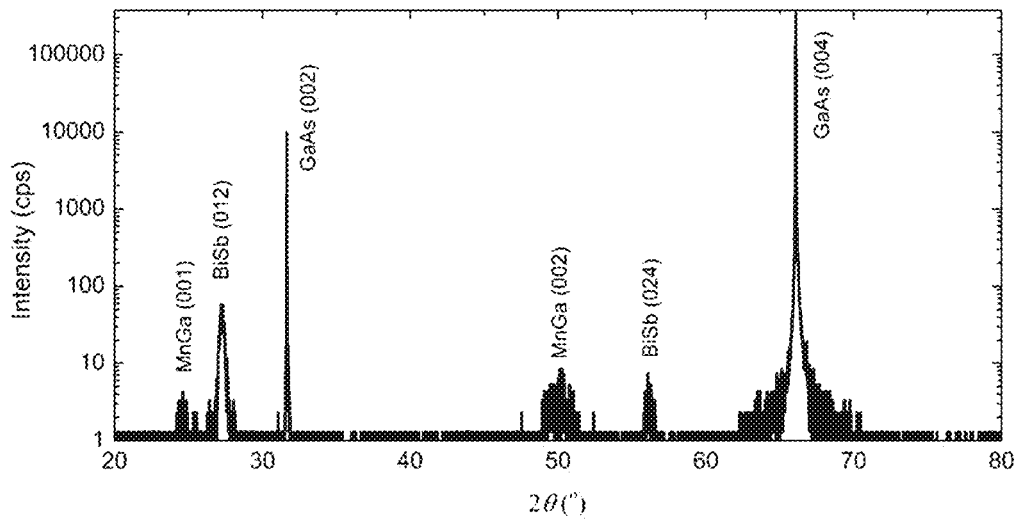
FIG. 5 is a diagram showing an X-ray diffraction spectrum of the MnGa/BiSb multilayer structure shown in FIG. 3.

FIG. 5 is a diagram showing an X-ray diffraction spectrum of the MnGa/BiSb multilayer structure shown in FIG. 3. As the measurement target, a BiSb layer of 20 nm was formed at a substrate temperature of 250° C. after a perpendicularly magnetized MnGa magnetic thin film of 10 nm was formed. It has been found that the BiSb film formed on the MnGa layer having a tetragonal1 crystal structure has a (012) orientation.

Furthermore, as shown in FIG. 5, the MnGa magnetic film has a tetragonal crystal structure. Accordingly, it has been found that the BiSb layer formed on the MnGa magnetic film has a (012) orientation. With this structure, the lower layer having a crystal structure with fourfold symmetry (tetragonal crystal structure or cubic crystal structure) is used to provide such a (012) orientation, which greatly contributes to generating a very large spin Hall effect.

(2) BiSb Characteristics Evaluation

(2.1) Electrical Conductivity

Figure 6A:
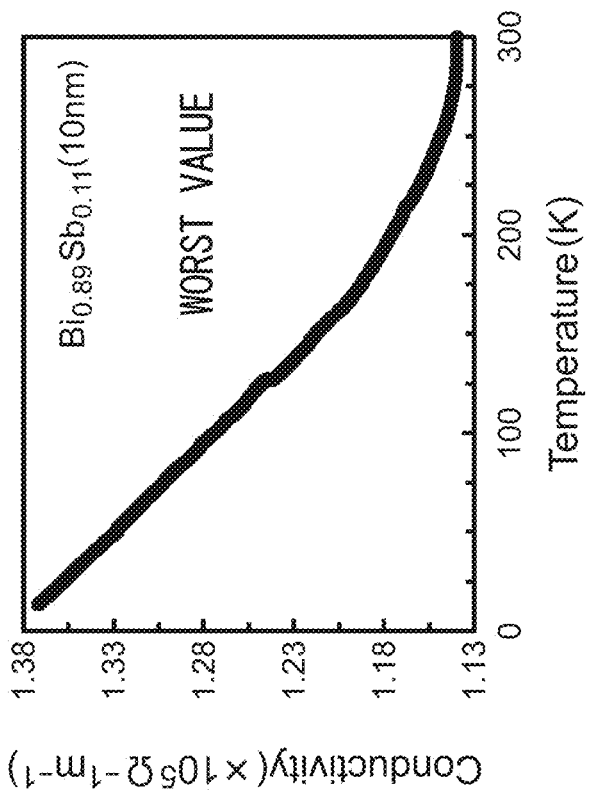
FIGS. 6A and 6B are diagrams each showing the temperature dependence of the electrical conductivity σ of the BiSb thin film (having a film thickness of 10 nm) thus formed.
Figure 6B:
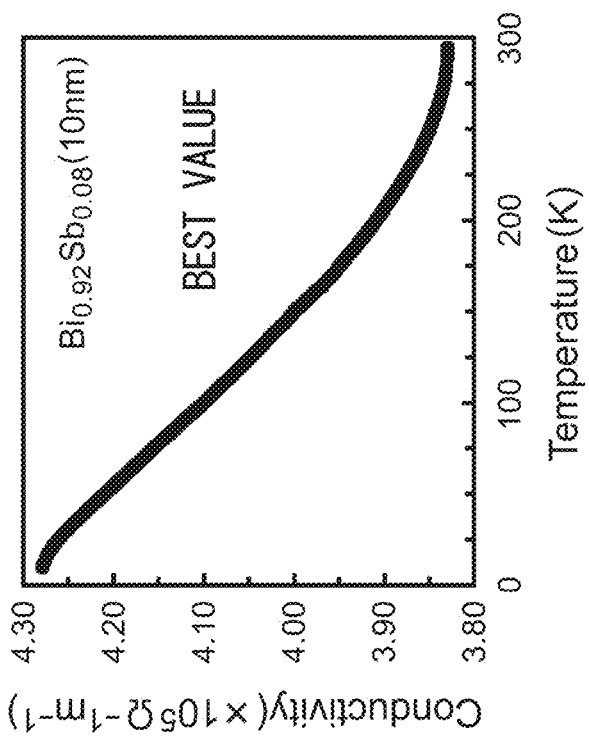

FIGS. 6A and 6B are diagrams each showing the temperature dependence of the electrical conductivity σ of the BiSb thin film (having a film thickness of 10 nm) thus formed. There is a difference in the composition ratio between FIGS. 6A and 6B. FIG. 6A shows the characteristics of a $Bi_{0.92}Sb_{0.08}$ sample. At room temperature, $\sigma_{BiSb} = 3.8 \times 10^5\ \Omega^{-1}m^{-1}$ was obtained. Furthermore, the electrical conductivity σ rises according to a reduction in the temperature. Thus, it has been found that this sample has metallic electrical conductivity characteristics.

On the other hand, FIG. 6B shows the characteristics of a $Bi_{0.89}Sb_{0.11}$ sample. This sample exhibits low electrical conductivity. However, at room temperature, $\sigma_{BiSb} = 1.1 \times 10^5\ \Omega^{-1}\ m^{-1}$ was obtained. The electrical conductivity of a BiSb thin film having a film thickness of 10 nm was $1 \times 10^5\ \Omega^{-1}m^{-1}$ to $4 \times 10^5\ \Omega^{-1}\ m^{-1}$, and $\sigma_{BiSb} \sim 2.5 \times 10^5\ \Omega^{-1}m^{-1}$ was obtained as an average value. This value is one order of magnitude higher than those provided by other kinds of topological insulators such as $Bi_3Se_2$ ($5 \times 10^4\ \Omega^{-1}m^{-1}$), $(Bi,Sb)_3Se_2$ ($2.2 \times 10^4\ \Omega^{-1}m^{-1}$), etc., and is close to the electrical conductivity values provided by metal materials typically employed in MRAM such as Ta ($5.2 \times 10^5$ $\Omega^{-1}\mathrm{m}^{-1}$) or CoFeB ($6 \times 10^5$ $\Omega^{-1}\mathrm{m}^{-1}$), for example.

(2.2) Spin Hall Angle

Figure 7:
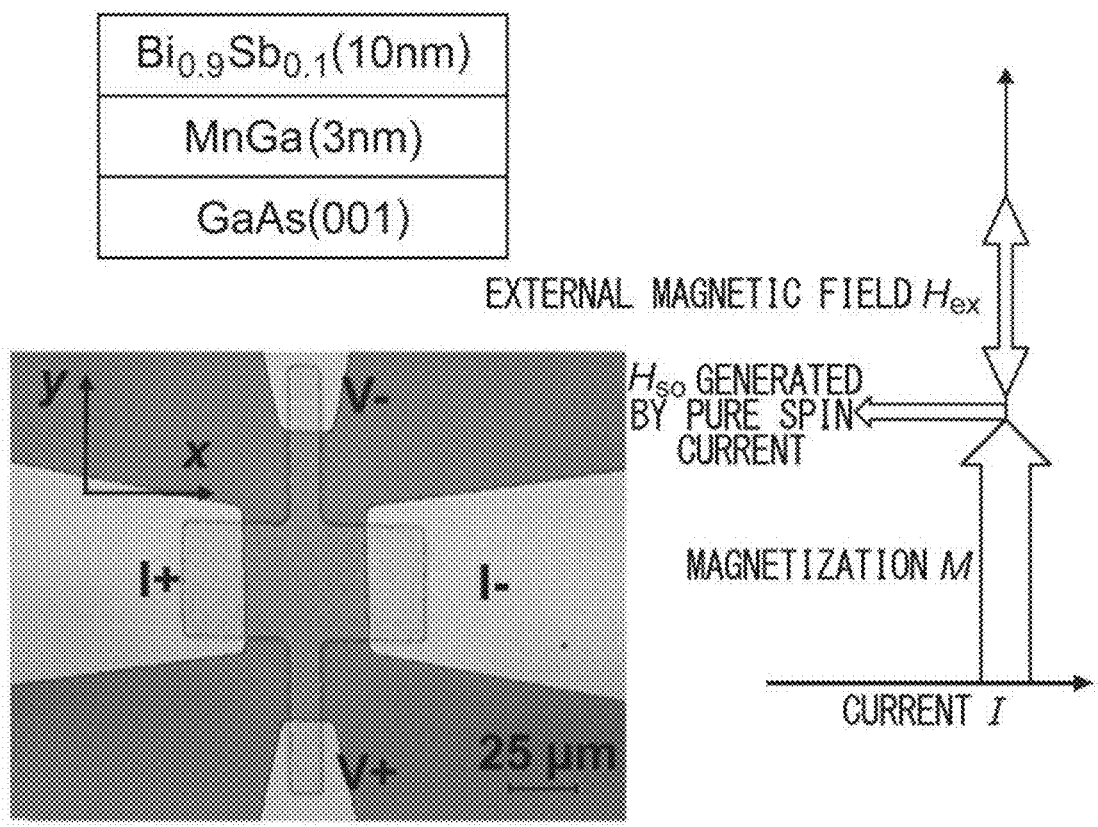
FIG. 7 shows a cross-sectional view and a plan view of a MnGa/BiSb multilayer structure according to an embodiment.

Next, description will be made regarding the evaluation results of the spin Hall angle of the BiSb layer. FIG. 7 shows a cross-sectional view and a plan view of the MnGa/BiSb multilayer structure according to an example. The multilayer structure is configured to include a perpendicularly magnetized MnGa layer having a film thickness of 3 nm and a BiSb layer having a film thickness of 10 nm, and to have an element size of 100 μm×50 μm. In this example, the magnetization of the MnGa layer is perfectly perpendicular. Accordingly, the pure spin current injected from the BiSb layer generates an effective in-plane magnetic field $H_{SO}$. The effective in-plane magnetic field has an effect of weakening the coercive force in the perpendicular direction.

Figure 8B:
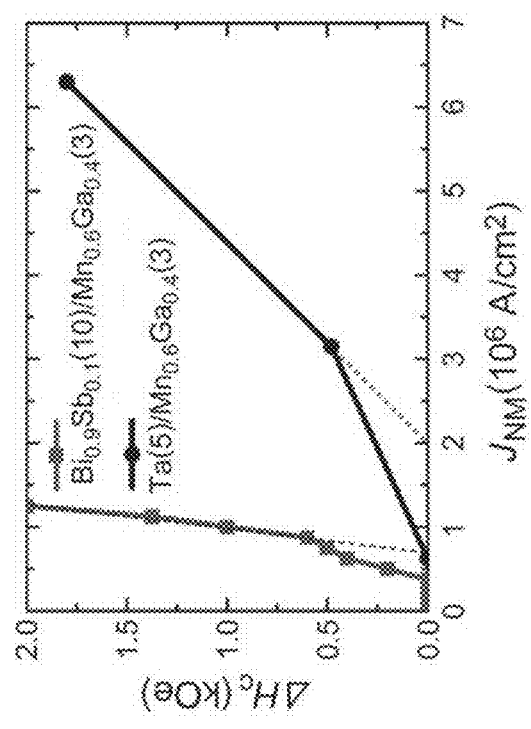
FIG. 8B is a diagram showing a relation between the change in the coercive force that occurs in the MnGa layer in the perpendicular direction and the current density $J_{MM}$ that flows through the BiSb layer.
Figure 8A:
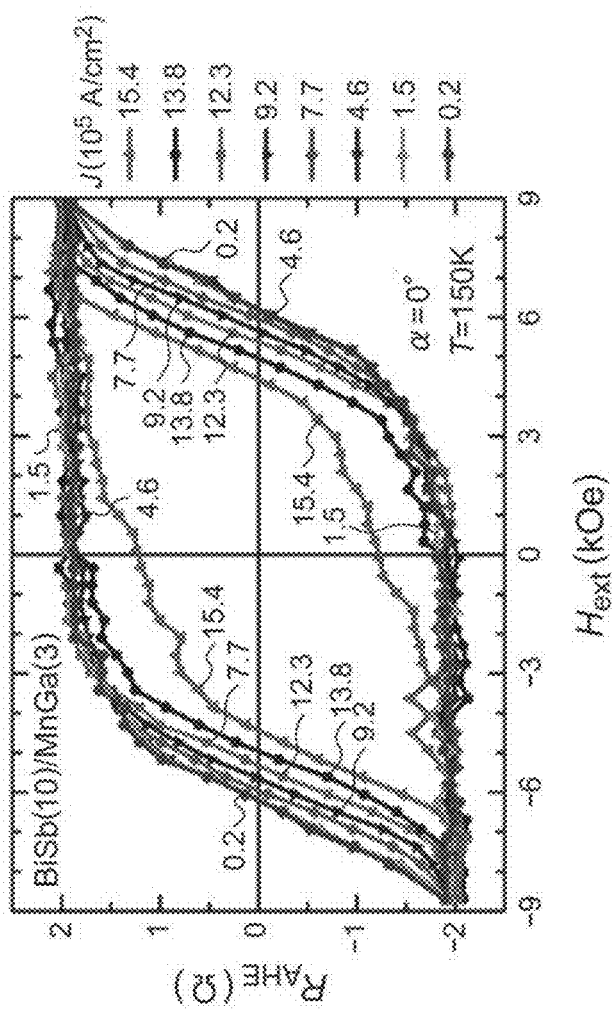
FIG. 8A is a diagram showing a magnetization hysteresis when a current flows between terminals $I_+$ and $I_-$ provided to the MnGa/BiSb multilayer structure.

FIG. 8A is a diagram showing magnetization hysteresis when a current flows between terminals $I_+$ and $I_-$ provided to the MnGa/BiSb multilayer structure. The magnetization hysteresis can be evaluated based on the measurement results of the Hall voltage that occurs due to the anomalous Hall effect that occurs between terminals $V_+$ and $V_-$. As shown in this drawing, it can be understood that the coercive force in the perpendicular direction decreases according to an increase of the in-plane current density. This reflects the effect of the effective magnetic field $H_{SO}$ that occurs due to the pure spin current.

FIG. 8B is a diagram showing a relation between the reduction $\Delta H_C$ of the coercive force in the perpendicular direction and the current density $J_{MM}$ that flows through the BiSb layer. As reference data, FIG. 8B also shows data of a multilayer structure formed of a MnGa layer (3 nm) and a Ta layer (5 nm). As can be understood from this drawing, in a case in which the BiSb layer is formed, the change in the coercive force per unit current density, i.e., $\Delta H_C/J_{MM}$, is 3.7 kG/(MA/cm$^2$). In contrast, in a case in which the Ta layer is formed, $\Delta H_C/J_{MM}$ is 0.35 kG/(MA/cm$^2$). As can be understood from this comparison result, the BiSb layer provides a very strong spin Hall effect.

As described above, in the prior research, when the spin Hall angle of an amorphous Bi layer on a magnetic layer was evaluated, the spin Hall angle was very small, that is, $\theta_{sh}=0.02$ or 0.00012 (Non-patent documents 1, 2). Furthermore, the $\sigma_{sh}$ of the BiSb layer obtained from the theoretical calculation was only on the order of $4.9 \times 10^4$ $\Omega^{-1}\mathrm{m}^{-1}$ at maximum. Accordingly, it was considered that the BiSb layer provides a spin Hall angle $\theta_{sh}$ on the order of only 0.5 at maximum.

Figure 9:
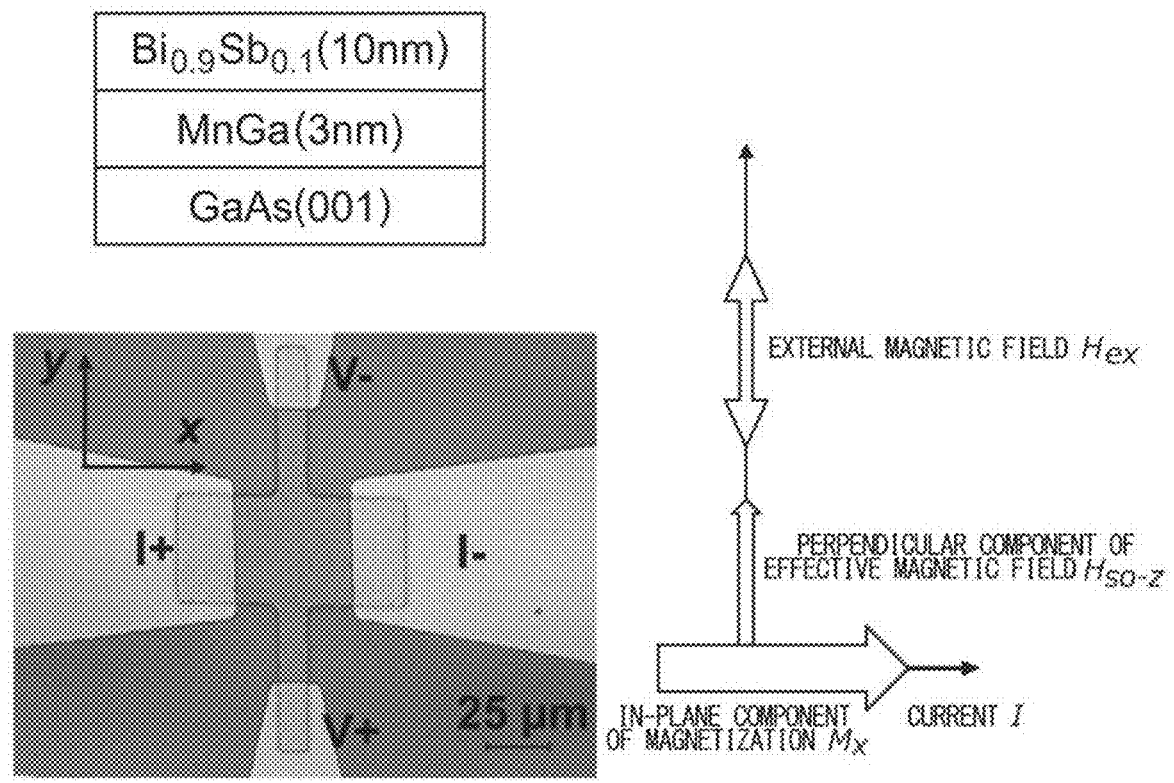
FIG. 9 shows a cross-sectional view and a plan view of a MnGa/BiSb multilayer structure according to an example.
Figure 10:
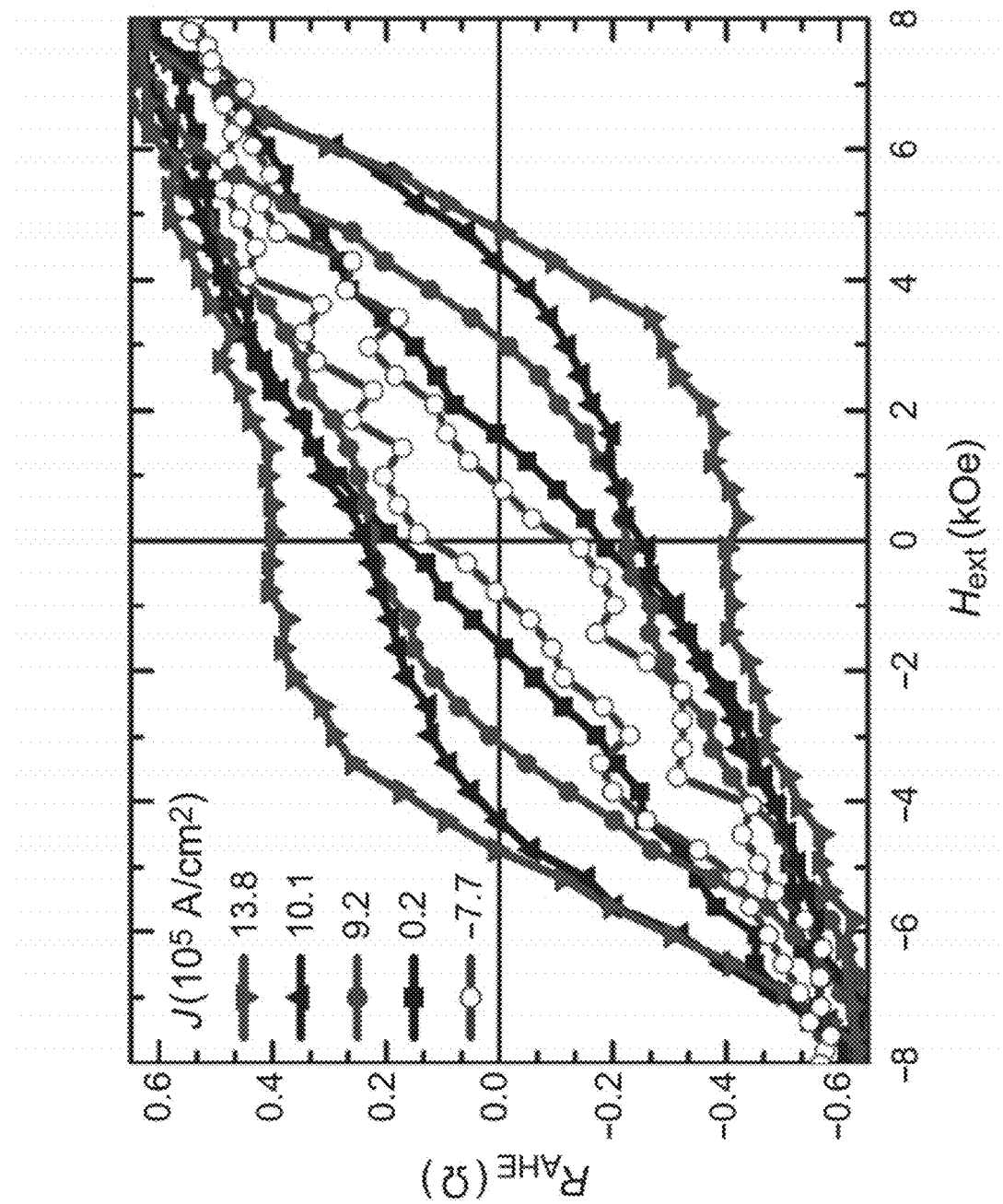
FIG. 10 is a diagram showing the magnetization hysteresis in the perpendicular direction when a current flows in the in-plane direction between the terminals $I_+$ and $I_-$ of the junction.

FIG. 9 shows a cross-sectional view and a plan view of a MnGa/BiSb multilayer structure according to an example. The multilayer structure is configured such that a BiSb layer having a thickness of 10 nm is layered on a MnGa layer having a thickness of 3 nm and having an in-plane magnetization component, which is formed as an element having a size of 100 μm×50 μm. With this example, the MnGa layer has an in-plane magnetization component. The effective magnetic field $H_{SO}$ that occurs due to the pure spin current injection has a perpendicular component, thereby providing an effect of raising the coercive force. FIG. 10 is a diagram showing the magnetization hysteresis in the perpendicular direction when a current flows in the in-plane direction between the terminals $I_+$ and $I_-$ of the junction. The magnetization hysteresis in the perpendicular direction can be evaluated based on the measurement results of the Hall voltage using the anomalous Hall effect that occurs between terminals $V_+$ and $V_-$. As shown in this drawing, it can be understood that the coercive force in the perpendicular direction rises according to an increase of the in-plane current density. This reflects the effect of the effective magnetic field $H_{SO}$ in the perpendicular direction.

Figure 11A:
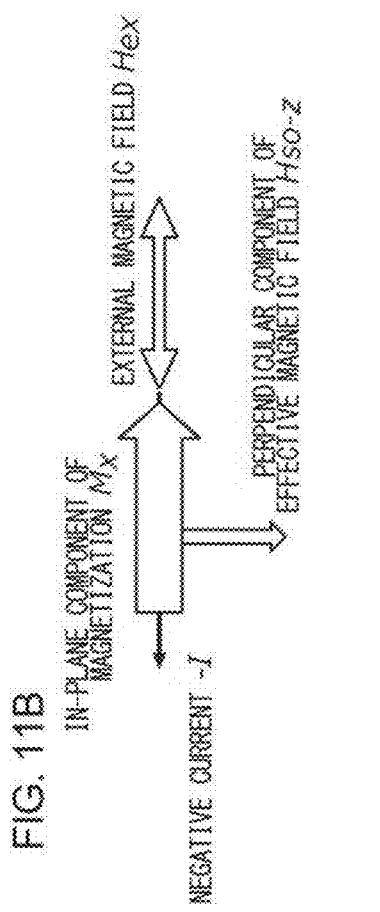
FIGS. 11A and 11B are diagrams each showing the magnetization hysteresis in the perpendicular direction when an external magnetic field is applied as an in-plane component to the same sample as that shown in FIG. 9.
Figure 11A:
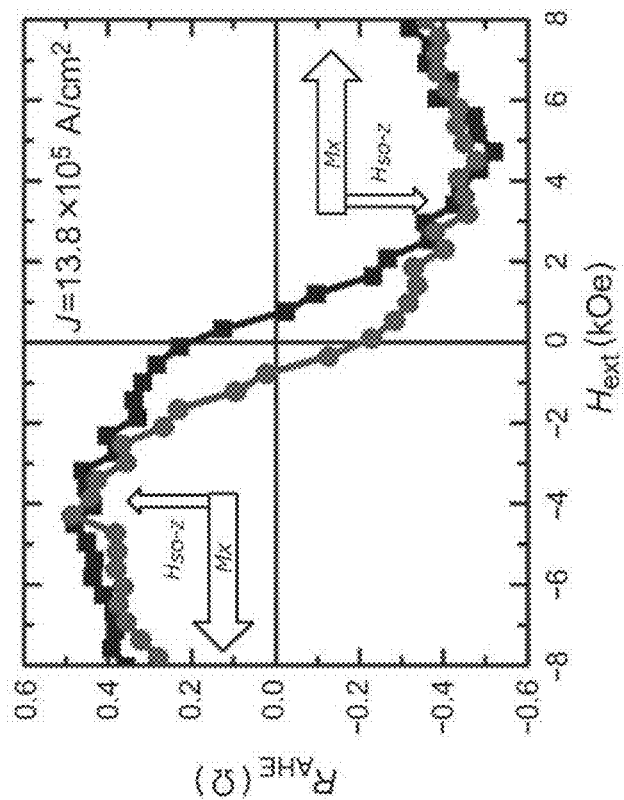
Figure 11B:
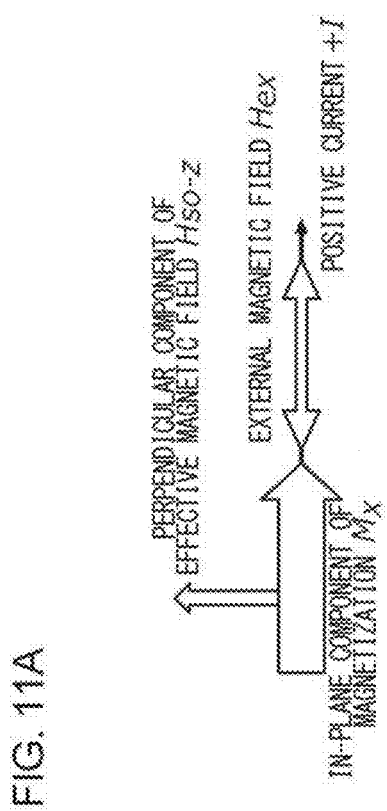
Figure 11B:
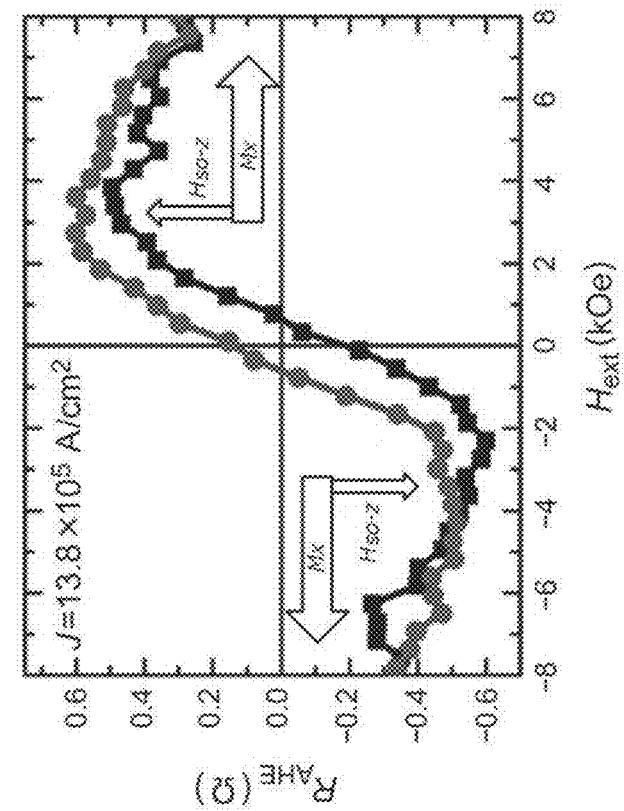

FIGS. 11A and 11B are diagrams each showing the magnetization hysteresis in the perpendicular direction when an external magnetic field is applied as an in-plane component. With this example, the effect of the perpendicular component of the effective magnetic field $H_{SO}$ can be easily observed.

FIG. 11A shows the measurement results when a positive current flowed. FIG. 11B shows the measurement results when a negative current flowed. In FIG. 11A, in a case in which the in-plane magnetic component is a right-direction component (when the in-plane external magnetic field is applied in the positive direction), the $H_{SO}$ is directed upward. Accordingly, in this case, the perpendicular magnetization component is positive. Conversely, in a case in which the in-plane magnetic component is a left-direction component (when the in-plane external magnetic field is applied in the negative direction), the perpendicular component of the effective magnetic field $H_{SO}$ is directed downward. Accordingly, in this case, the perpendicular magnetization component is negative.

In the case shown in FIG. 11B, for a current to flow in the reverse direction, the pure spin current is injected in the reverse direction. In this case, the perpendicular component of the effective magnetic field $H_{SO}$ and the perpendicular magnetic component have opposite behaviors with respect to those shown in FIG. 11A. Based on the results, the pure spin current injection effect by means of the BiSb layer has been confirmed.

Next, quantitative evaluation of the magnitude of the spin Hall effect is performed. In FIG. 10, the change in the coercive force $\Delta H_C$ itself corresponds to $H_{SO}$. That is to say, $H_{SO}=\Delta H_{CO}$ holds true. With the present invention, the pure spin current can be calculated using the following Expression (1).

$$J_S = M_{MnGa} \cdot t_{MnGa} \cdot \Delta H_C \tag{1}$$

Here, $M_{MnGa}$ (=250 emu/cc) represents the magnetization of the MnGa. $t_{MnGa}$ (=3 nm) represents the thickness of the MnGa magnetic layer. Furthermore, the spin Hall angle can be calculated using the following Expression (2).

$$\theta_{SH} = (2e/\hbar_{bar}) \cdot J_S / J_{BiSb} \tag{2}$$

Here, $J_{BiSb}$ represents the current density that flows through the BiSb layer, which can be calculated using the following Expression (3).

$$J_{BiSb} = I_{BiSb} / W \cdot t_{BiSb} = \tag{3}$$
$$(W \cdot t_{BiSb})^{-1} \cdot \sigma_{BiSb} \cdot t_{BiSb} / (\sigma_{BiSb} \cdot t_{BiSb} + \sigma_{MnGa} \cdot t_{MnGa}) \cdot I =$$
$$(W \cdot t_{BiSb})^{-1} \cdot \sigma_{BiSb} \cdot t_{BiSb} / (\sigma_{BiSb} \cdot t_{BiSb} + \sigma_{MnGa} \cdot t_{MnGa}) \times$$
$$W \cdot (t_{BiSb} + t_{MnGa}) \cdot J =$$
$$\sigma_{BiSb} \cdot (t_{BiSb} + t_{MnGa}) / (\sigma_{BiSb} \cdot t_{BiSb} + \sigma_{MnGa} \cdot t_{MnGa}) \cdot J$$

For example, in a case in which $\sigma_{BiSb}=2.5 \times 10^5$ $\Omega^{-1}\mathrm{m}^{-1}$, $\sigma_{MnGa}=5 \times 10^5$ $\Omega^{-1}\mathrm{m}^{-1}$, $t_{MnGa}=3$ nm, and $t_{BiSb}=10$ nm, when $J=1.38 \times 10^6$ A/cm$^2$, $J_{BiSb}=1.12 \times 10^6$ A/cm$^2$ is obtained. On the other hand, this current density generates $H_{SO}=\Delta H_C=3.1$ kOe=3100 Oe. This provides $H_{SO}/J_{BiSb}=2770$ Oe/(MA/ cm²). It can be understood that this value is several hundred times larger than the corresponding values of 5 to 10 Oe/(A/cm²) of conventionally researched heavy metal materials such as Ta or Pt. In a case in which the spin Hall angle of BiSb is calculated in actuality for each current value using Expressions (1) and (2), $\theta_{sh}$=52 is obtained as the average value of the spin Hall angle. This value is dramatically larger than those of a Ta layer ($\theta_{sh}$=0.15) or a Pt layer ($\theta_{sh}$=0.08) which are typically employed for MRAM. This value is approximately 100 times larger than the theoretically calculated value $\theta_{sh}$=0.5. Thus, it is thought that there is another mechanism that differs from the mechanism assumed in the theoretical calculation, which contributes to such a dramatically large spin Hall effect provided by the BiSb layer.

FIG. 12 is a diagram showing the spin Hall angle $\theta_{sh}$ at room temperature, the electrical conductivity σ, and the spin Hall conductivity $\sigma_{sh}$=($h_{bar}$/2e)·$\theta_{sh}$×σ for each material of the pure spin injection source. Based on the comparison results, it can be understood that the BiSb material provides overwhelmingly large spin Hall conductivity 1.3×10⁷ ($h_{bar}$/2e) $\Omega^{-1}m^{-1}$. This value is 200 times or more larger than the prediction value of the theoretical calculation, i.e., 4.9×10⁴ ($h_{bar}$/2e) $\Omega^{-1}m^{-1}$.

(2.3) Verification of Very-Low-Current Magnetization Reversal

As can be understood from FIG. 12, the spin Hall angle of the BiSb material is larger than that of other kinds of materials. Thus, it is considered that this allows the magnetization to be reversed using a very low current density.

Figure 13A:
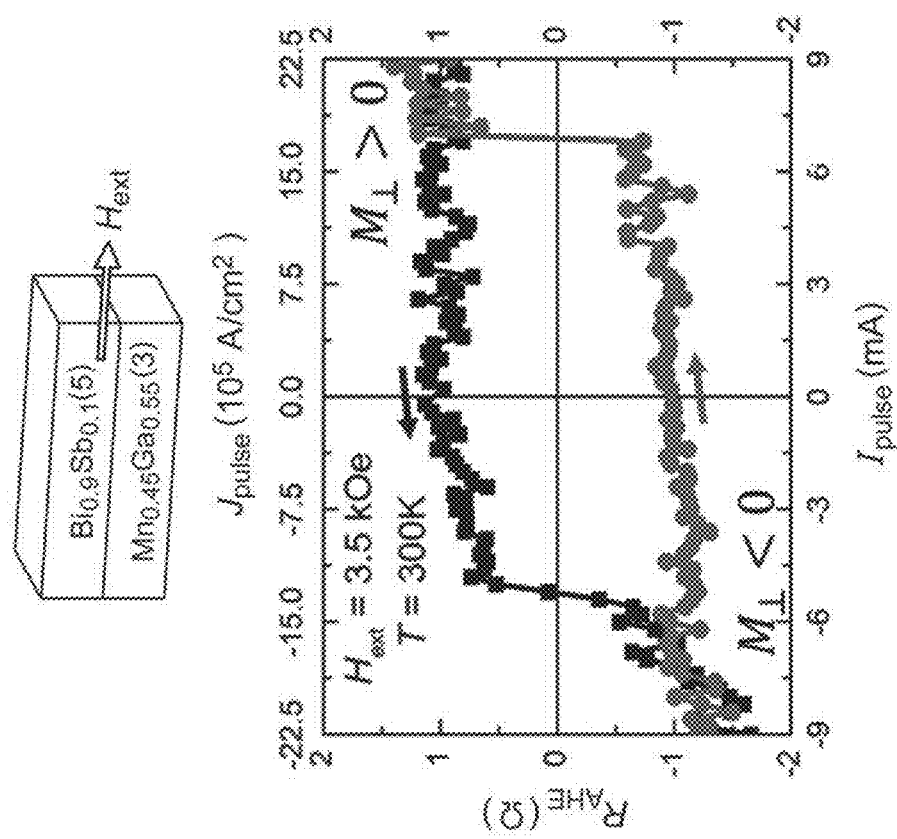
FIGS. 13A and 13B are diagrams each showing the magnetization reversal for the MnGa (3 nm)/BiSb (5 nm) junction using a pulse current.
Figure 13B:
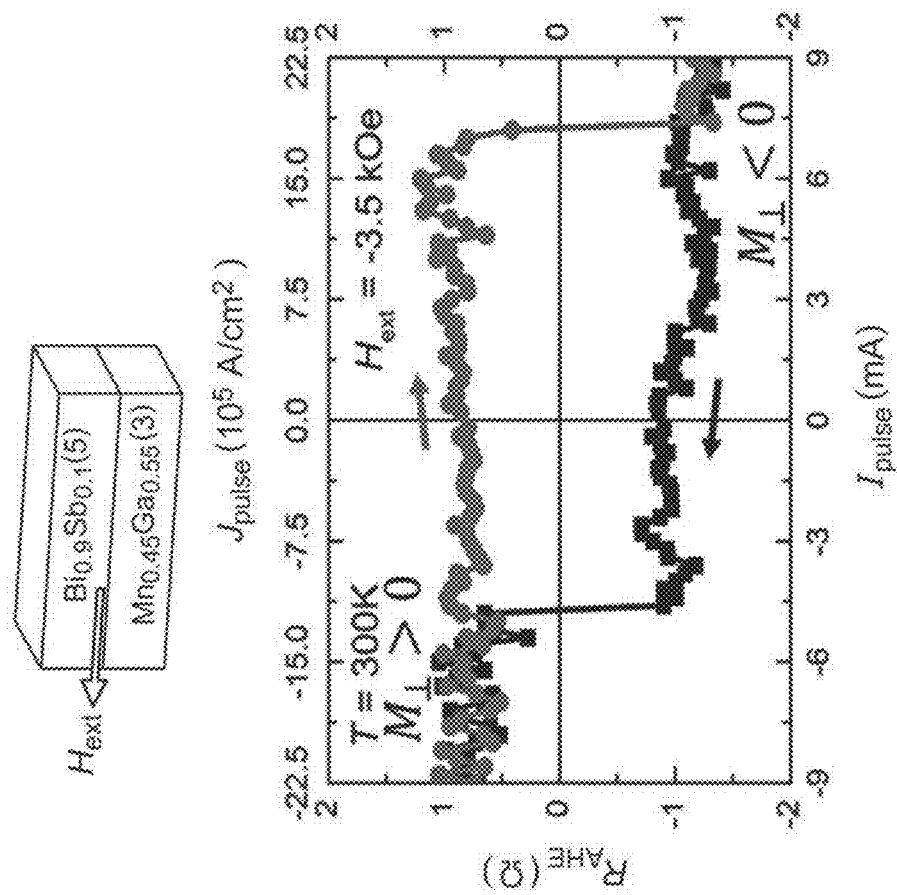

Magnetization reversal using a very low current density was performed for the MnGa/BiSb junction. FIGS. 13A and 13B are diagrams each showing the magnetization reversal for the MnGa (3 nm)/BiSb (5 nm) junction using a pulse current. Specifically, FIG. 13A shows the measurement result in a case in which a 100-msec pulse current was applied so as to provide magnetization reversal in a state in which an in-plane external magnetic field was applied in the left (negative) direction such that the magnetization was oriented toward the left side. As can be understood from this drawing, upon raising the positive current, the magnetization is reversed from upward to downward. Conversely, upon raising the negative current, the magnetization is reversed from downward to upward.

FIG. 13B shows the measurement result in a case in which a current was applied so as to provide magnetization reversal in a state in which an in-plane external magnetic field was applied in the right (positive) direction such that the magnetization was oriented toward the right side. As can be understood from this drawing, upon raising the positive current, the magnetization is reversed from downward to upward. Conversely, upon raising the negative current, the magnetization is reversed from upward to downward. That is to say, in a case of reversing the direction of the magnetization, the direction of the magnetization reversal is reversed according to the direction in which the magnetization is oriented. This measurement result is consistent with the characteristics of pure spin injection magnetization reversal.

Furthermore, it should be noted that the magnetization reversal requires only a very small current density J=1.5×10⁶ A/cm². As a comparison example, a MnGa(3 nm)/Ta(5 nm) junction requires J=1.1×10⁸ A/cm² to provide magnetization reversal. Also, a MnGa(3 nm)/IrMn(4 nm) junction requires J=1.5×10⁸ A/cm² to provide magnetization reversal. Also, a MnGa(2.5 nm)/Pt(2 nm) junction requires J=5.0×10⁷ A/cm² to provide magnetization reversal. In this example, it has been confirmed that very-low-current density magnetization reversal is provided due to the very large spin Hall effect of the BiSb material.

(3) Application to SOT-MRAM

Figure 14A:
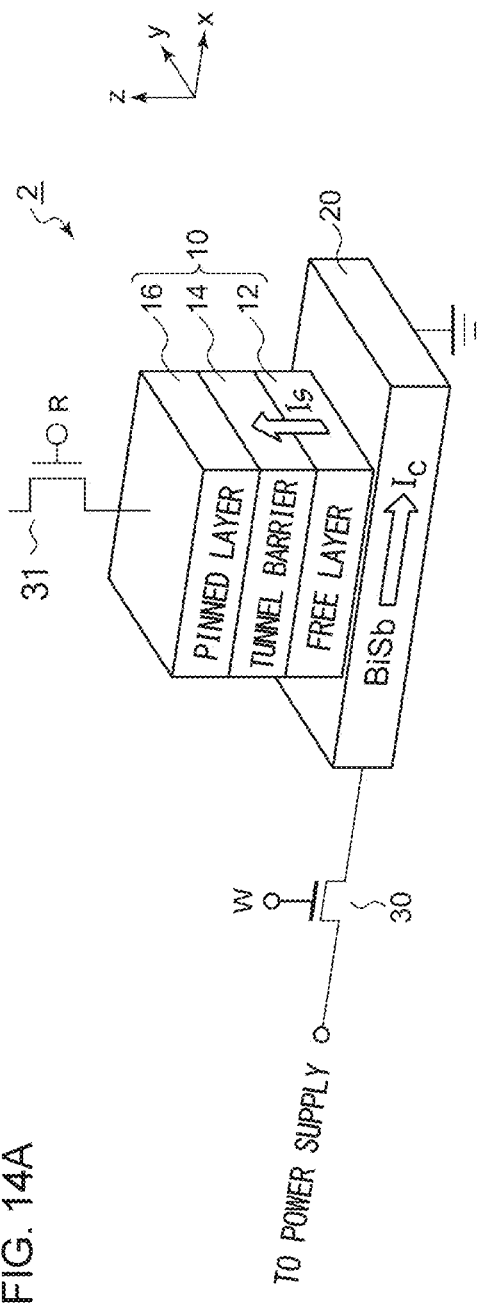
FIGS. 14A and 14B are diagrams each showing a schematic structure of a SOT-MRAM cell.
Figure 14B:
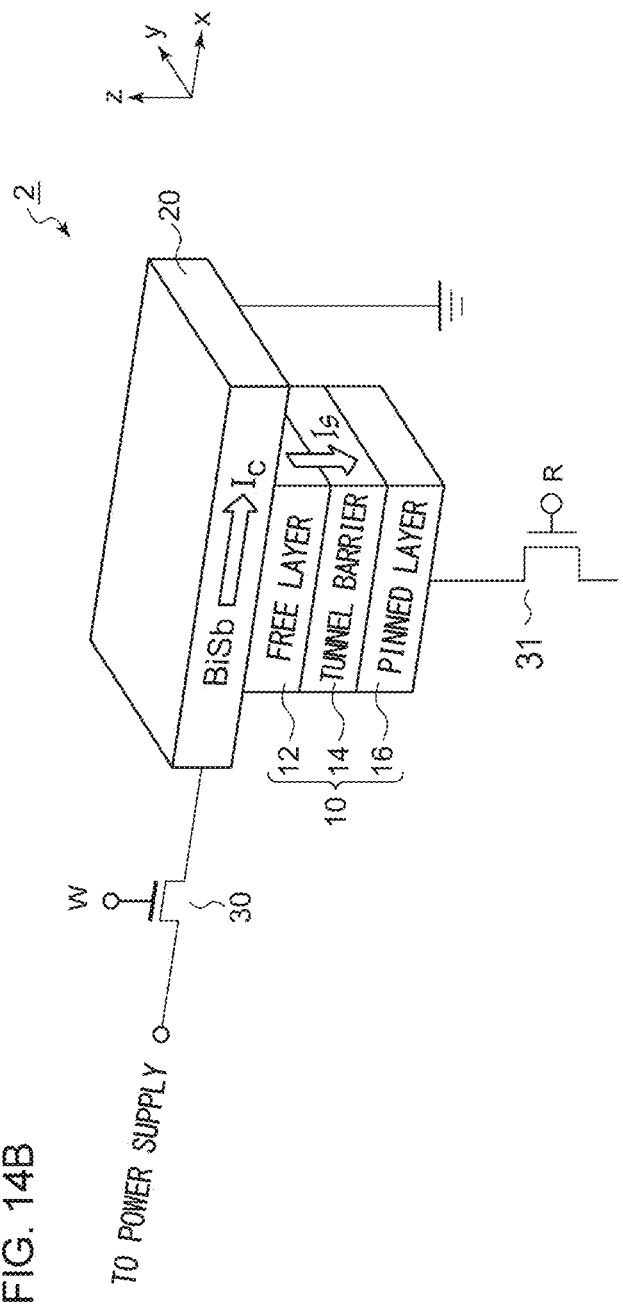

FIGS. 14A and 14B are diagrams each showing a schematic structure of a SOT-MRAM cell 2. Referring to FIG. 14A, the SOT-MRAM cell 2 includes an MTJ (Magnetic Tunnel Junction) element 10, a pure spin injection source 20, a write transistor 30, and a read transistor 31. The MTJ element 10 has a multilayer structure including a magnetization free layer 12, a tunnel barrier 14, and a magnetization pinned layer 16. The pure spin injection source 20 is coupled to the magnetization free layer 12. As the magnetization free layer 12, a MnGa layer may be employed, for example. However, the present invention is not restricted to such an arrangement. Also, other kinds of ferromagnetic metal materials may be employed. Examples that can be employed as the magnetization free layer 12 include: single-element magnetic metal materials such as Co, Fe, etc.; binary alloy materials such as CoFe, NiFe, MnAl, MnGe, FePt, etc.; ternary alloy materials such as CoFeB, CoMnSi, etc.; and multilayer structures including such magnetic material layers. The same can be said of the magnetization pinned layer 16. The tunnel barrier 14 is configured as an insulating layer. MgO is preferably employed for the tunnel barrier 14. Also, other kinds of materials such as AlO may be employed.

The pure spin injection source 20 includes the BiSb layer described above. That is to say, the junction of the magnetization free layer 12 and the pure spin injection source 20 configured as the BiSb layer can be regarded as the multilayer structure according to the example described above.

The pure spin injection source 20 configured as the BiSb layer is coupled to an unshown power supply (driver) via the write transistor 30. Upon turning on the write transistor 30, a pulse-type current Ic flows through the BiSb layer in the in-plane direction (x direction). In this state, a spin current $I_S$ flows in the perpendicular direction (z direction). This causes the occurrence of magnetization reversal in the magnetization free layer 12, thereby writing data.

FIG. 14B shows a SOT-MRAM structure obtained by geometrically reversing the structure shown in FIG. 14A.

Lastly, description will be made regarding the performance of the SOT-MRAM employing the BiSb layer.

Description will be made assuming that a φ37 nm MRAM element manufactured by TDK Corporation is employed as an example. In a case in which a BiSb layer having a thickness of 5 nm is employed as the pure spin injection source, a current of 2.2 μA is required to cause the occurrence of magnetization reversal in the φ37 nm MRAM element. In contrast, with a conventional spin injection magnetization reversal method, current of 24 μA is required to cause the occurrence of magnetization reversal. Accordingly, in a case in which the BiSb layer is employed for the SOT-MRAM, such an arrangement allows the write current and write electric power to be reduced to ¹/₁₀ times that provided by STT-MRAM. Furthermore, the SOT-MRAM is capable of writing data at a rate that is 10 times higher than that provided by the STT-MRAM. Accordingly, the SOT-MRAM employing the BiSb layer allows the data writing energy to be reduced to ¹/₁₀₀ times that provided by the STT-MRAM.

Furthermore, in a case in which the write current can be reduced, this arrangement provides the wiring with improved reliability. Moreover, such an arrangement does not require the write current to directly flow through the MTJ element, thereby increasing the operating life. Furthermore, this arrangement allows the resistance of the MTJ element to be increased so as to reduce the read current, thereby allowing the read electric power to be reduced. In a case in which the write current can be reduced, this arrangement allows the size of the driving transistor to be reduced on the order of 1/10 times. This allows the degree of integration to be raised, thereby allowing the memory capacity to be increased.

(4) Two-terminal Memory Cell

The BiSb material has the characteristic that two-dimensional current is dominant in a topological surface state. In a case in which SOT-RAM having a perpendicular magnetization layer is provided using such a characteristic, such an arrangement can be configured as two-terminal SOT-RAM.

Figure 15:
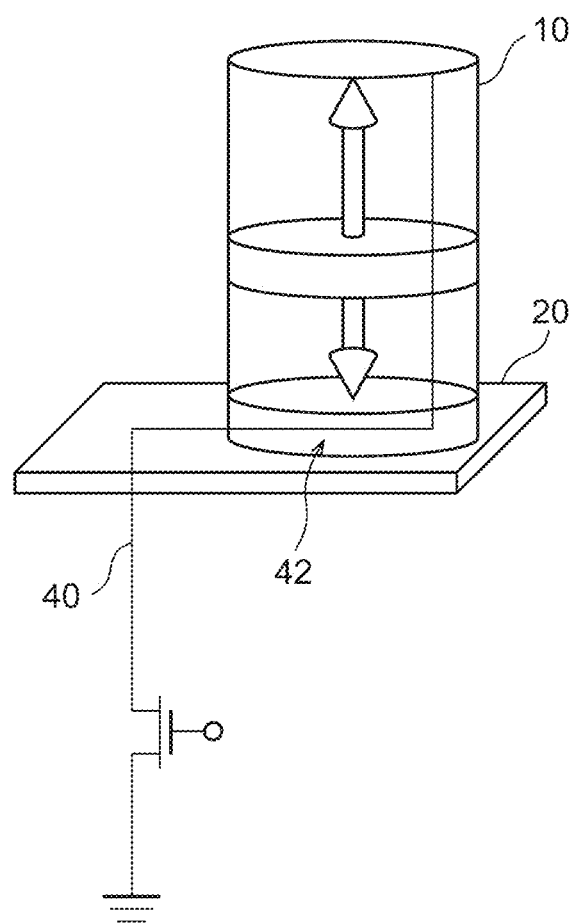
FIG. 15 is a schematic diagram showing a two-terminal SOT-RAM.

FIG. 15 is a schematic diagram showing the two-terminal SOT-RAM. With typical SOT-RAM, as shown in FIG. 14, a write path is an in-plane path that differs from a read path configured as a perpendicular path. Such an arrangement requires three terminals, i.e., two transistors 30 and 31. Furthermore, in a case of employing perpendicular magnetization, such an arrangement requires a bias magnetic field to be applied in the in-plane direction. In contrast, in a case of employing the BiSb layer, as shown in FIG. 15, this arrangement allows data writing using a perpendicular current path 40. This is because such an arrangement requires only a current that flows in the perpendicular direction to provide an in-plane current 42 in the BiSb layer, thereby injecting a pure spin current using the spin Hall effect. As a result, a single transistor 32 functions as both a read transistor and a write transistor, thereby allowing the SOT-RAM to be configured as a two-terminal SOT-RAM. Furthermore, a current flows in the device in the perpendicular direction, thereby providing the spin transfer torque effect. This arrangement provides magnetic reversal without a need to apply the in-plane bias magnetic field.

Figure 16A:
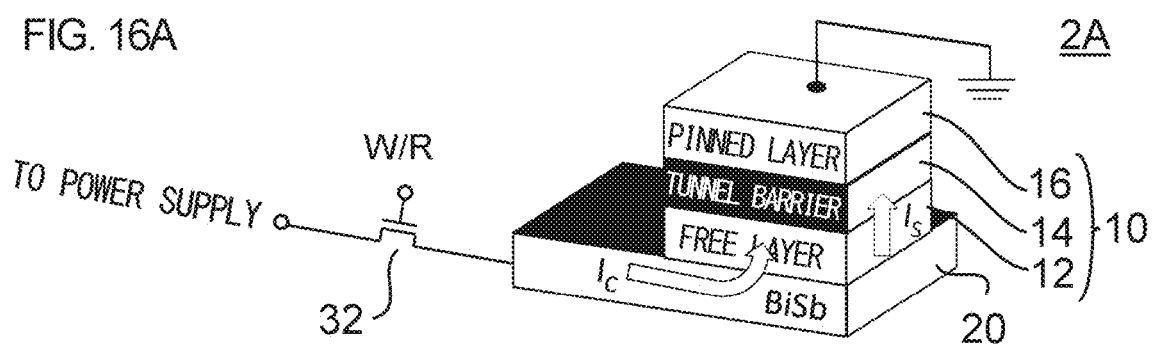
FIGS. 16A and 16B are diagrams each showing a schematic structure of a two-terminal SOT-MRAM cell.
Figure 16B:
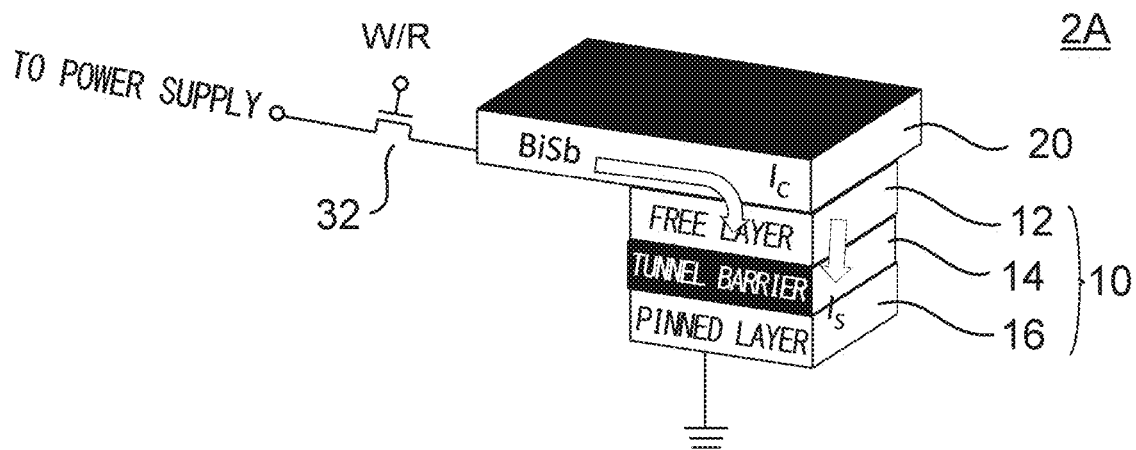

FIGS. 16A and 16B are diagrams each showing a schematic structure of a two-terminal SOT-MRAM cell 2A. Referring to FIG. 16A, the SOT-MRAM cell 2A includes an MTJ (Magnetic Tunnel Junction) element 10, a pure spin injection source 20, and a read/write transistor 32. In the SOT-MRAM 2 shown in FIGS. 14A and 14B, the pure spin injection source 20 is grounded (coupled to the source line). In contrast, in FIGS. 16A and 16B, the magnetization pinned layer 16 of the MnGa magnetic thin film 10 is grounded. The SOT-MRAM shown in FIG. 16B has a structure obtained by geometrically reversing the structure shown in FIG. 16A.

Description has been made in the embodiment regarding an example in which the BiSb pure spin injection source is employed in MRAM. However, the present invention is not restricted to such an application. Also, the BiSb pure spin injection source can be employed in various kinds of applications that require such a pure spin injection source such as a microwave generator using precession of a magnetic layer.

While the preferred embodiments of the present invention have been described using specific terms, such description is for illustrative purposes only, and it is to be understood that changes and variations may be made without departing from the spirit or scope of the appended claims.

The invention claimed is:

1. Magnetoresistive memory comprising:
an MTJ (magnetic tunnel junction) element comprising a magnetization free layer; and
a pure spin injection source comprising a BiSb layer structured as a topological insulator having a spin Hall angle larger than 0.5 and a conductivity on the order of $10^5$ $\Omega^{-1}m^{-1}$ due to a topological surface state, which is coupled to the magnetization free layer via an interface,
wherein the interface is provided such that it is orthogonal to the direction of crystal growth of the BiSb layer,
and wherein the magnetoresistive memory is structured to flow an in-plane current through the BiSb layer so as to supply a pure spin current to the magnetization free layer in a direction that is perpendicular to the interface, thereby providing magnetization reversal of the magnetization free layer.

2. The magnetoresistive memory according to claim 1, wherein the BiSb layer has a spin Hall effect in the topological surface state, and is structured to supply a pure spin current generated by the spin Hall effect to the magnetization free layer in a direction that is perpendicular to the interface, and to control the magnetization free layer by means of a spin-orbit torque component that is orthogonal to the direction of spin polarization due to the pure spin current injection and the magnetization direction of the magnetization free layer.

3. The magnetoresistive memory according to claim 1, wherein the BiSb layer has a (012) orientation.

4. The magnetoresistive memory according to claim 1, wherein each cell is structured to have two terminals by using a topological surface state of the BiSb layer.

5. The magnetoresistive memory according to claim 4, structured to operate without application of an in-plane bias magnetic field.

6. A manufacturing method for magnetoresistive memory, comprising:
forming a magnetization free layer; and
forming a pure spin injection source comprising a BiSb layer,
wherein the BiSb layer has a (012) orientation.

7. A pure spin injection source structured to inject a pure spin current to a magnetic body,
wherein the pure spin injection source comprises a BiSb layer structured as a topological insulator having a spin Hall angle larger than 0.5 and a conductivity on the order of $10^5$ $\Omega^{-1}m^{-1}$ due to a topological surface state, which is coupled to the magnetic body via an interface,
wherein the interface is provided such that it is orthogonal to the direction of crystal growth of the BiSb layer,
and wherein a pure spin current is supplied to the magnetic body in a direction that is perpendicular to the interface according to an in-plane current that flows through the BiSb layer.

8. The pure spin injection source according to claim 7, wherein the BiSb layer is structured as a crystalized layer.

9. Magnetoresistive memory comprising:
an MTJ (magnetic tunnel junction) element comprising a magnetization free layer; and
a pure spin injection source comprising a BiSb layer coupled to the magnetization free layer,
wherein a lower layer having a cubic crystal structure is employed so as to provide the BiSb layer with a (012) orientation.

* * * * *